(12) United States Patent
Ganon et al.

(10) Patent No.: US 12,066,488 B2
(45) Date of Patent: Aug. 20, 2024

(54) EMBEDDED PHY (EPHY) IP CORE FOR FPGA

(71) Applicant: Western Digital Technologies, Inc., San Jose, CA (US)

(72) Inventors: Doron Ganon, Kfar Vradim (IL); Eitan Lerner, Karmiel (IL)

(73) Assignee: Sandisk Technologies, Inc., Milpitas, CA (US)

( * ) Notice: Subject to any disclaimer, the term of this patent is extended or adjusted under 35 U.S.C. 154(b) by 0 days.

(21) Appl. No.: 18/197,902

(22) Filed: May 16, 2023

(65) Prior Publication Data
US 2023/0305058 A1 Sep. 28, 2023

Related U.S. Application Data

(62) Division of application No. 16/805,244, filed on Feb. 28, 2020, now Pat. No. 11,675,008.

(51) Int. Cl.
| | | |
|---|---|---|
| *G01R 31/28* | (2006.01) | |
| *G01R 31/00* | (2006.01) | |
| *G01R 31/3183* | (2006.01) | |
| *G06F 1/04* | (2006.01) | |
| *G06F 7/64* | (2006.01) | |
| *G06F 30/347* | (2020.01) | |

(52) U.S. Cl.
CPC ... *G01R 31/318335* (2013.01); *G01R 31/002* (2013.01); *G06F 1/04* (2013.01); *G06F 7/64* (2013.01); *G06F 30/347* (2020.01)

(58) Field of Classification Search
CPC .......... G01R 31/318335; G01R 31/002; G06F 30/347; G06F 31/002; G06F 1/04; G06F 7/64
See application file for complete search history.

(56) References Cited

U.S. PATENT DOCUMENTS

| | | | |
|---|---|---|---|
| 6,907,008 B1 * | 6/2005 | Moskovich | H04L 9/40 709/224 |
| 9,026,854 B2 | 5/2015 | Jeong et al. | |
| 9,591,221 B2 | 3/2017 | Miller et al. | |
| 9,684,184 B2 | 6/2017 | Miller et al. | |

(Continued)

FOREIGN PATENT DOCUMENTS

CN 109411007 A 3/2019

OTHER PUBLICATIONS

Li, Jinhua et al.; "Implementing 2.5G MIPI D-PHY Controllers"; XILINX, UltraScale, XAPP1339, v1.0, www.xilinx.com, Oct. 31, 2018 (77 pages).

(Continued)

*Primary Examiner* — Christine T. Tu
(74) *Attorney, Agent, or Firm* — PATTERSON + SHERIDAN, LLP

(57) ABSTRACT

The present disclosure generally relates to an embedded physical layer (EPHY) for a field programmable gate array (FPGA). The EPHY for the FPGA is for a testing device that can receive and transmit in both the high speed PHYs, as well as low speed PHYs, such as MIPI PHYS (MPHYs), to meet universal flash storage (UFS) specifications. The testing device with the EPHY for the FPGA provides flexibility to support any specification updates without the need of application specific (ASIC) production cycles.

19 Claims, 4 Drawing Sheets

(56) References Cited

U.S. PATENT DOCUMENTS

2010/0313089 A1* 12/2010 Rajski ............ G01R 31/318547
                                                            714/E11.155
2019/0020822 A1   1/2019 Sharma et al.
2023/0123826 A1*  4/2023 Magee ................. G11C 7/1069
                                                            365/233.1

OTHER PUBLICATIONS

Toshiba Memory Corporation, "Toshiba Unveils First Demonstration System to Support Version 1.1 of Universal Flash Storage (UFS) Specification" https://business.toshiba-memory.com/zh-cn/company/newa/news-topics/2012/ufs.html, Jun. 13, 2019 (3 pages).
Arasan Chip Systems Inc, "UFS Adoption Accelerates"; Arasan White Paper, https://www.arasan.com/wp-content/uploads/2016/05/UFS-Whitepaper-Sept-122016.pdf; Sep. 2016 (34 pages).
Haines, Andre, "Design Consideration for UFS & eMMC Controllers"; Arasan Chip Systems, Inc.; https://www.flashmemorysummit.com/English/Collaterals/Proceedings/2013/20130813_101B_Haines.pdf (18 pages).

* cited by examiner

EMBEDDED PHY (EPHY) IP CORE FOR FPGA

CROSS-REFERENCE TO RELATED APPLICATIONS

This application is a divisional of co-pending U.S. patent application Ser. No. 16/805,244, file Feb. 28, 2020, which is herein incorporated by reference.

BACKGROUND OF THE DISCLOSURE

Field of the Disclosure

Embodiments of the present disclosure generally relate to an embedded physical layer (EPHY) for a field programmable gate array (FPGA).

Description of the Related Art

As devices are developed, they need to be validated with a testing device. Typical testing devices include an FPGA that has high speed physical layers (PHYs). Many devices to be tested require low speed PHYs, such as the Mobile Industry Processor Interface (MIPI) PHYS (MPHY), interfaces to meet universal flash storage (UFS) specifications. The typical FPGA, due to the presence of high speed PHYs, are unable to adequately test and validate the devices that require low speed PHYs. In order to adequately test and validate the devices, an external low speed PHY chip is used to align the low speed PHYs with the high speed PHYs.

There are many problems with using an external low speed PHY chip. For example, the MPHY to unified protocol (UNIPRO) MAC interface (I/F) is the remote monitor and maintenance interface (RMMI) MIPI standard, which requires for a four lane use case: 40 signals per lane for transmission and 40 signals per lane for receiving, and will require 40 (for the signals)×2 (for transmission and receiving)×4 (for the lanes) for the data. RMMI is the MIPI UNIPRO specification name. In total, including control signals, there are more than 100 signals (40×2×4 for data alone). Using a large amount of signals forces the testing device FPGA to have a large input/output (I/O) count that increases the total system bill of materials (BOM) cost. Also, an external testing PHY chip on a shuttle application specific integrated circuit (ASIC) has a substantial cost of a few hundred US dollars per chip. Additionally, scalability for the next generation of devices is a concern because the interface is limited on I/O counts at speed, and therefore the next speed for the next generation of devices will need to double the speed on the I/F or double the I/O, both of which are not feasible. Finally, to gain time and be the first device in the market, relying on the ASIC PHY design and waiting for the next test chip (for the next generation speed) to be developed depends upon the timing of the ASIC PHY release and thus does is naturally delayed.

The capabilities are thus limited since the testing device does not see the I/F to a device under testing (DUT). Due to the limitation, mimicking other devices for testing is limited, as is validation of DUTs. Hence, using an external PHY device to implement MPHY, which is the current solution for UFS testing devices, is not optimal.

An ASIC tape out will cost millions of US dollars for a prototype shuttle. By using the existing high speed PHY in the FPGA that already supports high speed and meets the next generation (and several generations thereafter), the analog portion of the low speed PHY development is not required. Whenever the high speed PHY industry advances in one-two speed generations as compared to low speed PHY, using the FPGA for low speed PHY will fit for the next generation as well. Therefore, there is a need in the art for a testing device that can accommodate both high speed PHYs as well as low speed PHYs.

SUMMARY OF THE DISCLOSURE

The present disclosure generally relates to an embedded physical layer (EPHY) for a field programmable gate array (FPGA). The EPHY for the FPGA can be for a testing device that can receive and transmit in both high speed PHYs as well as low speed PHYs to meet universal flash storage (UFS) specifications. In other cases, it can be used for any application that needs to implement MIPI PHY such as data storage/memory applications (e.g., UFS flash memory), display applications (e.g., Liquid Crystal Display (LCD), communication applications (e.g., Wi-Fi) and more. The testing device (or any platform) with the EPHY for the FPGA provides flexibility to support any specification updates without the need of application specific integrated circuit (ASIC) production cycles.

While the description will be made with reference to a testing device, it is to be understood that the disclosure is not limited to testing devices. Rather, the embodiments discussed herein are applicable to any FPGA environment using mixed speed PHYs. In one or more embodiments, each FPGA gigabit transceiver (GT) (PHY) is used for one pair of transmitter and receiver lines which can work in all speeds. Stated another way, the same GT PHY is used for all speeds. The amount of GT PHYs within the FPGA is related to the number of lanes that are required on the specific interface.

In one embodiment, a testing device comprises: a field programmable gate array (FPGA); and an embedded physical layer (EPHY). The EPHY includes: a logic portion having a first logical phy and a second logical phy, wherein the logic portion is disposed in the FPGA; and a glue hardware portion. The glue hardware portion includes: a first differential amplifier; and a first multiplexer (MUX) coupled to the first differential amplifier, wherein the testing device is capable of receiving and sending signals at a first speed, wherein the testing device is capable of receiving and sending signals at a second speed, and wherein the second speed is greater than the first speed.

In another embodiment, an embedded physical layer (EPHY) comprises: a glue hardware portion; and a logic portion, wherein the logic portion comprises: a plurality of transmission blocks that each includes: a transmission finite state machine (FSM); a transmission multiplexer (MUX) coupled to the transmission FSM; a first PHY of a first speed coupled to the transmission FSM; and a second PHY of a second speed coupled to the transmission FSM, wherein the second speed is greater than the first speed; and a plurality of receive blocks that each includes: a receive FSM; a receive MUX coupled to the receive FSM; a third PHY of a third speed coupled to the receive FSM; and a fourth PHY of a fourth coupled to the receive FSM, wherein the fourth speed is greater than the third speed.

In another embodiment, a testing device comprises: a field programmable gate array (FPGA); means to increase amplitude of a signal received from a device under testing (DUT) of a first speed to an amplitude of a signal of a second speed, wherein the means to increase is coupled to the FPGA; and means to decrease amplitude of a signal received from a DUT of the second speed to an amplitude of a signal of the first speed, wherein the means to decrease is coupled to the FPGA.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s). Throughout the specification, the terms low speed PHY and low speed FPGA PHY are used interchangeably. Similarly, the terms high speed PHY and high speed FPGA PHY are used interchangeably.

The present disclosure generally relates to testing device comprising an embedded physical layer (EPHY) and a field programmable gate array (FPGA). The testing device can receive and transmit in both high speed PHYs as well as low speed PHYs to meet universal flash storage (UFS) specifications. The testing device with the EPHY and the FPGA provides flexibility to support any specification updates without the need of application specific (ASIC) production cycles.

Figure 1:
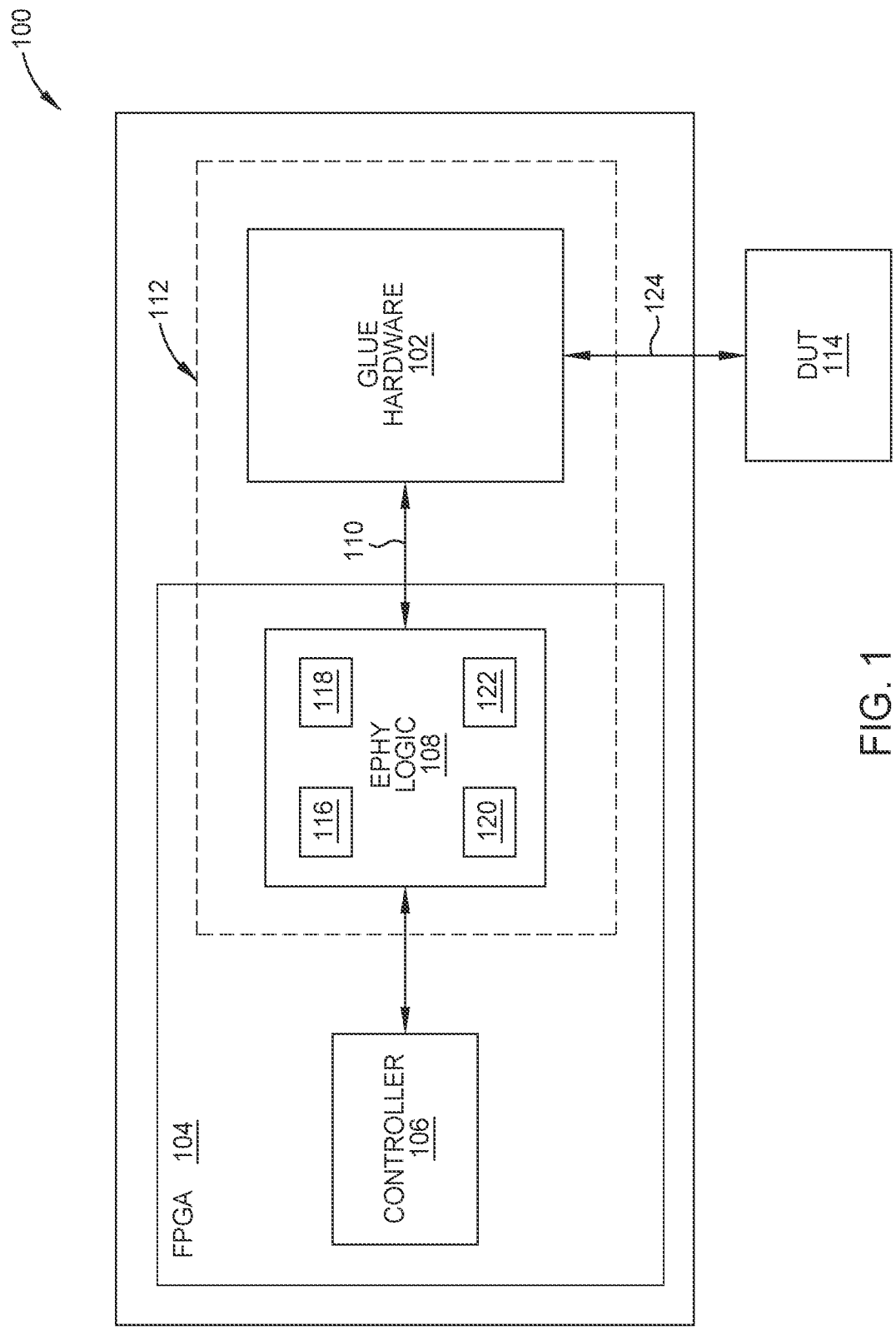
FIG. 1 is a schematic illustration of a testing device coupled to a DUT according to one embodiment.

FIG. 1 is a schematic illustration of a testing device 100 coupled to a DUT 114 according to one embodiment. As shown in FIG. 1, the testing device 100 includes an FPGA 104 that has a controller 106. The testing device 100 also includes an EPHY 112 that is coupled to the controller 106. The EPHY includes two components: EPHY logic 108 and glue hardware 102. The EPHY logic 108 is contained within the FPGA 104 and communicates with the DUT 114 through the glue hardware 102. More specifically, the FPGA 104 is physically connected to the glue hardware 102 through one or more transmission or receiving lines 110. The EPHY logic 108 includes one or more logical transmission blocks 116, one or more logical receiving blocks 118, one or more logical high speed interfaces 120, and one or more logical low speed interfaces 122. The glue hardware communicates with the DUT 114 through one or more transmission or receiving lines 124. The glue hardware 102 is the physical hardware of the EPHY 112 that is attached to or "glued" to the board or substrate upon which the testing device 100 is fabricated.

Numerous DUTs 114 operate with high speed transmissions while other DUTs 114 operate with lower speed transmissions. The testing device 100 is able to communicate with (e.g., send transmissions to and/or receive transmissions from) either a lower speed device or a higher speed device. An example of a high speed transmission is greater than 24 Gbs/s while an example of a low speed transmission is less than 24 Gbs/s. It is to be understood that the specific speeds exemplified are for example only. The disclosure is not to be limited to specific speeds. Rather, the testing device 100 is capable of communicating with devices of different transmission speeds or operating under different transmission standards. For example, the testing device 100 may be understood to send and receive transmissions at a first speed and at a second speed that is different from the first speed. In one embodiment, the first speed is greater than the second speed.

It is to be appreciated that the testing device 100 is capable of testing different DUTs 114 that each operates according to different transmission speeds, even if operating under the same standard. Furthermore, it is to be appreciated that the testing device 100 is capable of testing different DUTs 114 that each operate according to substantially the same transmission speeds, even if operating under different standards. Additionally, it is to be understood that the testing device 100 is capable of testing different DUTs 114 that each operate according to different transmission speeds and different standards. Finally, it is to be understood that the testing device 100 is capable of testing different DUTs 114 that each operate according to substantially the same transmission speeds as well as the same standard.

Figure 2:
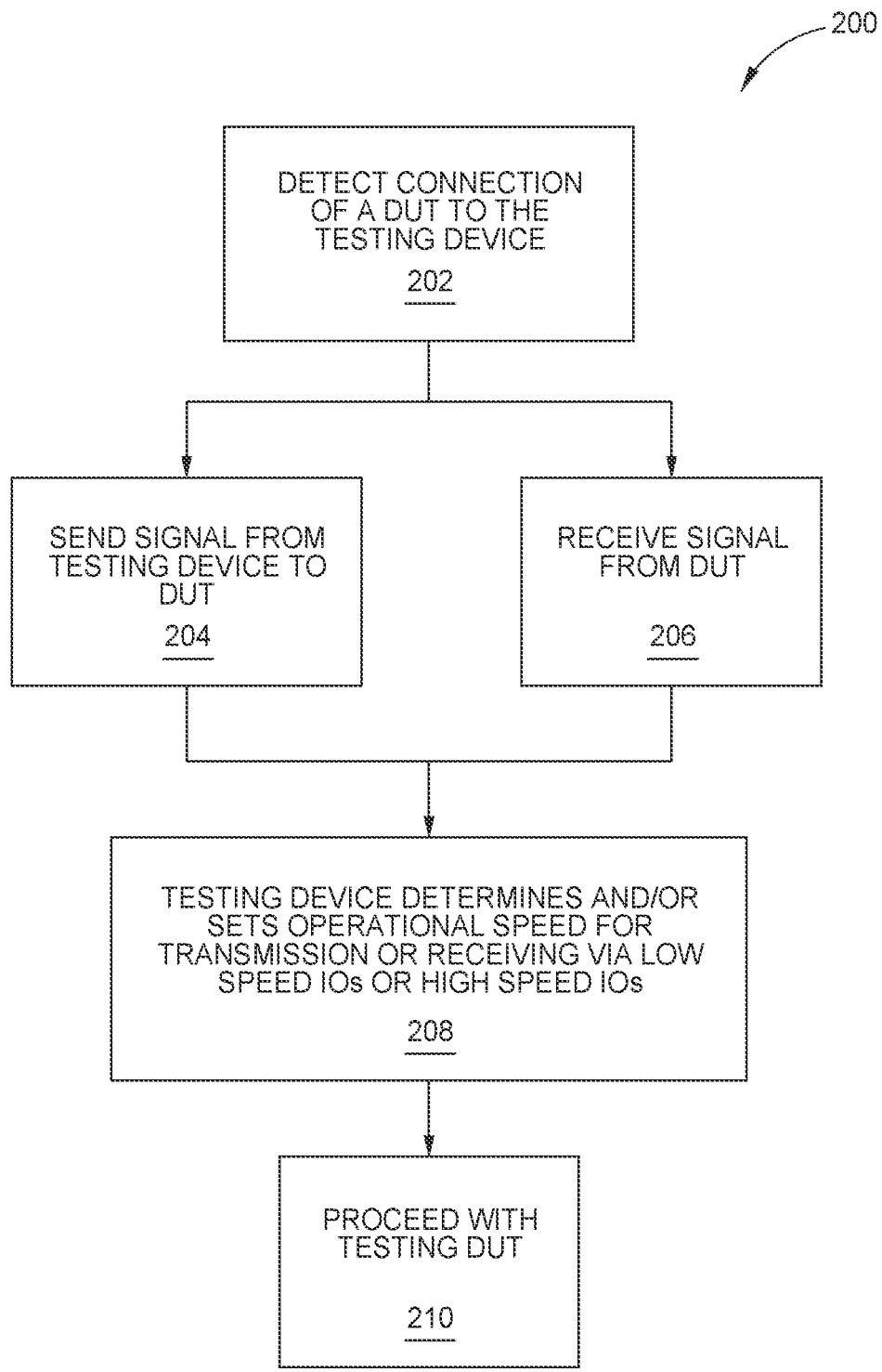
FIG. 2 is a flowchart illustrating a method of testing a device.

FIG. 2 is a flowchart 200 illustrating a method of testing a device. The testing begins by initially connecting the DUT 114 to the testing device 100. The testing device 100 detects that the DUT 114 is connected to the testing device in block 202.

Then, a signal may be sent to the DUT 114 from the testing device 100 in block 204. The signal may be sent from the testing device 100 to the DUT 102 with a high speed transmission, a low speed transmission or both a low speed transmission and a high speed transmission. In one embodiment, multiple signals are sent to the DUT 114 according to at least two different standards. For example, in one embodiment, a transmission is sent to the DUT 114 according to the MIPI standard. In another embodiment, two transmissions are sent to the DUT 114 with a transmission according to the MIPI standard and another transmission according to a different standard. It is to be understood that while the MIPI standard, high speed transmission, and low speed transmission have been described, the disclosure is not to be limited as such. Rather, if multiple transmissions are sent from the testing device 100 to the DUT 114, the transmission speed of at least one transmission of the multiple transmissions is at a different transmission speed than the transmissions speed of another transmission.

Instead of sending a signal from the testing device 100 to the DUT 114, a signal may be received from the DUT 114 at the testing device 100 in block 206. The transmission speed or standard for the DUT 114 will be determined by the DUT 114. It is contemplated that blocks 204 and 206 may both occur either simultaneously or in any order.

After the signal has been sent and/or received by the testing device 100, the testing device controller 106 in the FPGA 104 will determine which speed and/or protocol to utilize for transmissions sent to or received from the DUT 114 in block 208. Finally, the testing proceeds in block 210.

In order to transmit and/or receive at different transmission speeds and/or different standards, the testing device 100 will include at least two different interfaces (e.g., a high speed interface and a low speed interface).

Figure 3:
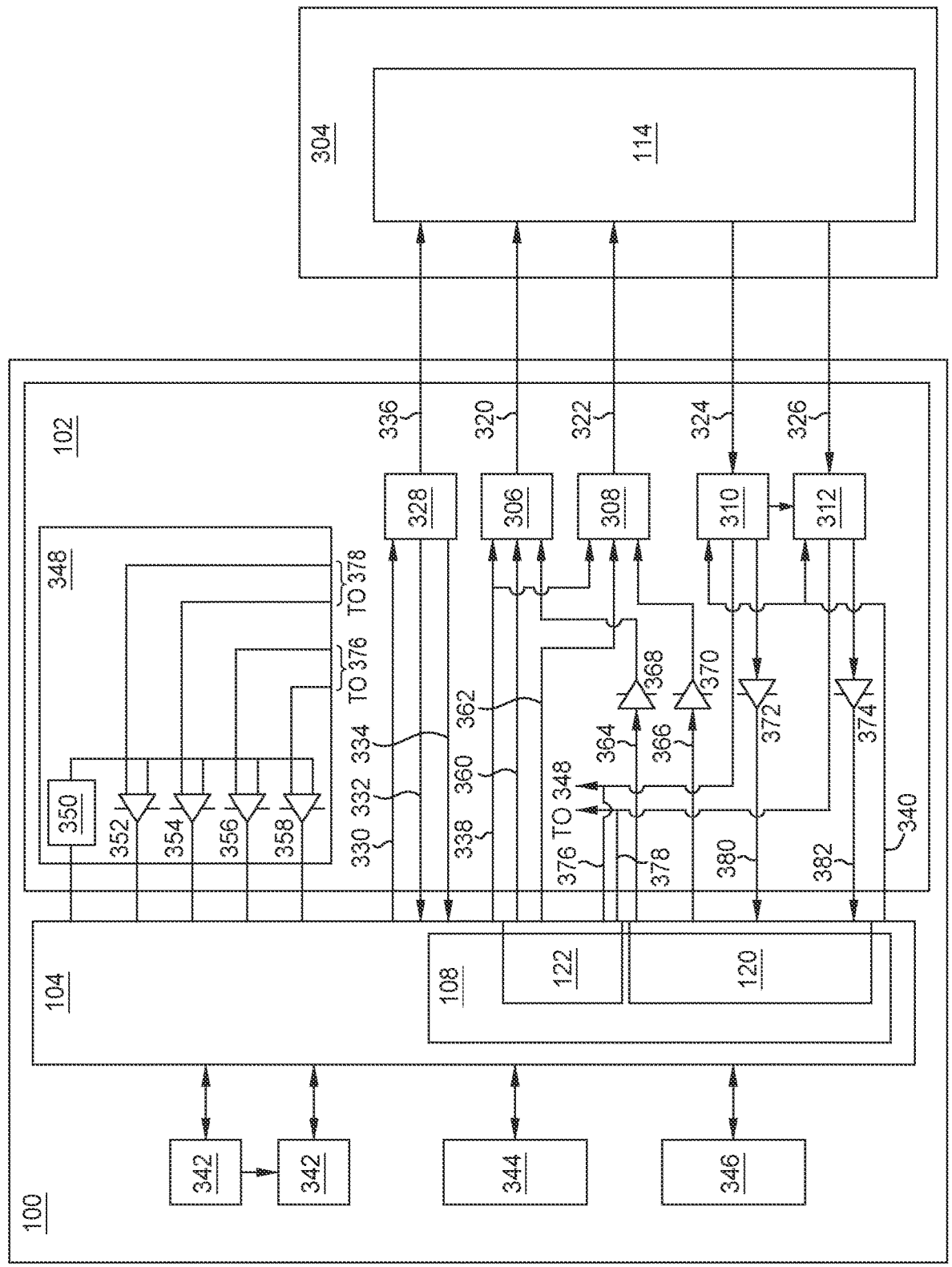
FIG. 3 is a more detailed view of the testing device of FIG. 1 coupled to a DUT according to one embodiment.

FIG. 3 is a more detailed illustration of the testing device 100 connected to a DUT 114 according to one embodiment. FIG. 3 illustrates a more detailed illustration of the glue hardware 102 of the testing device 100. It is to be understood that while a two-lane interface is shown, the architecture is not to be limited to two lanes, but rather, can support more lanes such as four lanes. FIG. 3 illustrates the testing device 100 coupled to a DUT 114 that is coupled to a DUT evaluation board 304 according to one embodiment. In one embodiment, the testing device 100 is based on the FPGA low speed PHY (e.g., less than 24 Gbs/s PHY) I/O for a low speed interface 122 (e.g., MIPI DPHY) and the FPGA high speed PHY (e.g., 24 Gbs/s or greater PHY) I/O for a high-speed interface 120 (e.g., GTY PHY). The testing device 100 utilizes multiplexers (MUXs) 306, 308, 310, 312 coupled to the FPGA 104. The MUXs 306, 308, 310, 312 are used on both the high speed and low speed connections to multiplex the signals, and the MUXs 306, 308, 310, 312 also use the FPGA hardware drivers to meet the MIPI specification analog levels (i.e., common mode, amplitude) that are not aligned to the high speed PHY of the FPGA 104. In one embodiment, the MUXs 306, 308, 310, 312 are capable of supporting about 7 GHz to about 8 GHz toggling and meet the UFS generation 4 (G4) speed, as well as higher speeds for future generations.

In one embodiment, the testing device 100 has the "master" role in the testing process and acts, in essence, as a host. The testing device 100 knows the speed/mode that is running in order to control the MUXs 306, 308, 310, 312 to use either the low speed interface 122 or the high-speed interface 120. For example, the testing device 100 has at least one low speed transmission line 320 coupled between MUX 306 and the DUT 114. Additionally, as an example, the testing device 100 includes at least one high speed transmission line 322 coupled between MUX 308 and the DUT 114. The testing device 100 also includes at least one low speed receiving line 324 coupled between MUX 310 and the DUT 114. Finally, the testing device 100 includes at least one high speed receiving line 326 coupled between MUX 312 and the DUT 114. In operation, the low speed mode works at a mode of a none-terminated channel while the high speed must be terminated. In one embodiment, on the burst, the high-speed termination may be disconnected from each receiving line 324, 326, while the testing device 100 hibernates or enters a stall state.

The testing device 100 also includes a phase lock loop (PLL) 328 coupled to the FPGA 104. The FPGA 104 sends a control signal along line 330 to the PLL 328 while the PLL 328 sends a reference clock signal to the FPGA 104 along line 332 and a UFS reference clock signal to the FPGA 104 along line 334. The PLL 328 also sends a reference clock signal to the DUT 114 along line 336.

In one embodiment, the FPGA 104 is coupled to (e.g., directly connected to) the MUXs 306, 308, 310, 312 via a transmission bus and a receiving bus, and more specifically via P and N lines. Each transmission/receiving signal at low speed or high speed are differential signal pairs. The buses select whether a high speed or low speed MUX 306, 308, 310, 312 is necessary. More specifically, the FPGA 104 is coupled to MUXs 306, 308 through line 338 and to MUXs 310, 312 through line 340.

In one embodiment, the FPGA 104 is also coupled to storage units 342, which may comprise any well-known data storage device. While two storage units 342 are shown, it is to be understood that more or less storage units 342 may be present. The FPGA 104 is also coupled to an FPGA board I/F 344 and a tester platform or tester appliance I/F 346.

In one embodiment, the FPGA 104 is also coupled to an impedance detection unit 348. The impedance detection unit 348 includes an adjustable regulator 350 that is coupled to the FPGA 104. The impedance detection unit 348 also includes a plurality of comparators 352, 354, 356, 358. The comparators 352, 354, 356, 358 have a bypass option to have a direct connection to the DUT 114. The output of the comparators 352, 354, 356, 358 is coupled to the FPGA 104. The adjustable regulator 350 is also coupled to the inputs of the comparators 352, 354, 356, 358.

In one embodiment, on the transmission side, the FPGA 104 is coupled to the MUXs 306, 308, 310, 312. Specifically, low speed interface 122 is coupled to transmission MUX 306 via line 360 and transmission MUX 308 via line 362. Similarly, high-speed interface 120 is coupled to transmission MUX 306 via line 364 and transmission MUX 308 via line 366. Because the DUT 114 may be operating at a low speed, differential amplifiers 368, 370 are disposed along lines 364, 366 respectively. The differential amplifiers 368, 370 reduce the high amplitude signal to the low amplitude signal (e.g., MIPI MPHY) on the transmission lines 364, 366.

On the receiving side, receiving MUX 310 is coupled to the low speed interface 122 via line 376, and receiving MUX 312 is coupled to the low speed interface 122 via line 378. The receiving MUXs 310, 312 toggle between terminated lines (e.g., high speed lines) to non-terminated lines (e.g., low speed lines) as required by MIPI specifications. Thus, lines 324, 326 will "see" non-terminated lines on low speed or hibernated state as needed by the specification as well as terminated for high speed to meet the transmission line signal integrity as defined by MIPI specifications. The receiving MUXs 310, 312 are also coupled to the impedance detection unit 348 via lines 376, 378. Receiving MUX 310 is coupled to the high-speed interface 120 via line 380, and receiving MUX 312 is coupled to the high-speed interface 120 via line 382. Because the DUT 114 may be operating at a low speed, differential amplifiers 372, 374 are disposed along lines 380, 382 respectively. The differential amplifiers 372, 374 increase the low amplitude signal (e.g., MIPI MPHY) to the high amplitude signal on the transmission lines 380, 382.

The glue hardware 102 of the EPHY 112 includes the impedance detection unit 348, the differential amplifiers 368, 370, 372, 374, the MUXs 302, 306, 310, 312, and the PLL 328.

As discussed above, DUTs 114 typically operate at a single speed or under a specific standard. If multiple DUTs 114 are to be tested, and those DUTs 114 operate at different speeds and/or different standards, then dedicated testing devices 100 for each DUT 114 would be inefficient, especially if a different testing device 100 is needed for each speed and each standard. The testing device 100 described herein eliminates the problem of needing a dedicated testing device for each speed and each standard. The testing device 100 is capable of transmission to a DUT 114 using whatever speed and/or standard that the DUT 114 requires. The testing device 100 is also capable of receiving from a DUT 114 using whatever speed and/or protocol that the DUT 114 requires. This speed and standard versatility of the testing device 100 permits any DUT 114 using any speed or standard to be tested 100 without the need for a dedicated testing device 100 for each speed or protocol.

Consider an example where the DUT operates at a lower speed, yet the testing device operates using the MIPI standard. The transmissions received from the DUT can be received at the lower speed and then 'sped up' to the MIPI standard for processing in the testing device. Any transmissions sent from the testing device to the DUT can be 'slowed down' from the MIPI standard speed to the lower speed. Thus, in the example, a testing device operating under the MIPI standard can test a device that operates under slower speeds.

Consider another example where the DUT operates at a higher speed such as MIPI standard, yet the testing device operates using the lower speed. The transmissions received from the DUT can be received using the MIPI standard and then 'slowed down' for processing in the testing device. Any transmissions sent form the testing device to the DUT can be 'sped up' to the MIPI standard speed. Thus, in the example, a testing device operating under a low speed can test a DUT that operates under the MIPI standard.

The examples above serve to illustrate how the testing device 100 disclosed herein is capable of testing devices without restrictions on the transmission speeds or protocols. The disclosure herein is not to be limited to MIPI protocol devices (either testing to being tested). As will be discussed below, the transmission and receiving blocks 404, 406, 432, 434 within the logic 108 of the testing device 100 operate to 'speed up' or slow down' the communications between the testing device 100 and the DUT 114 to permit the testing device 100 to test any DUT 114 regardless of the transmission speed or protocol of both the testing device 100 and DUT 114.

Figure 4:
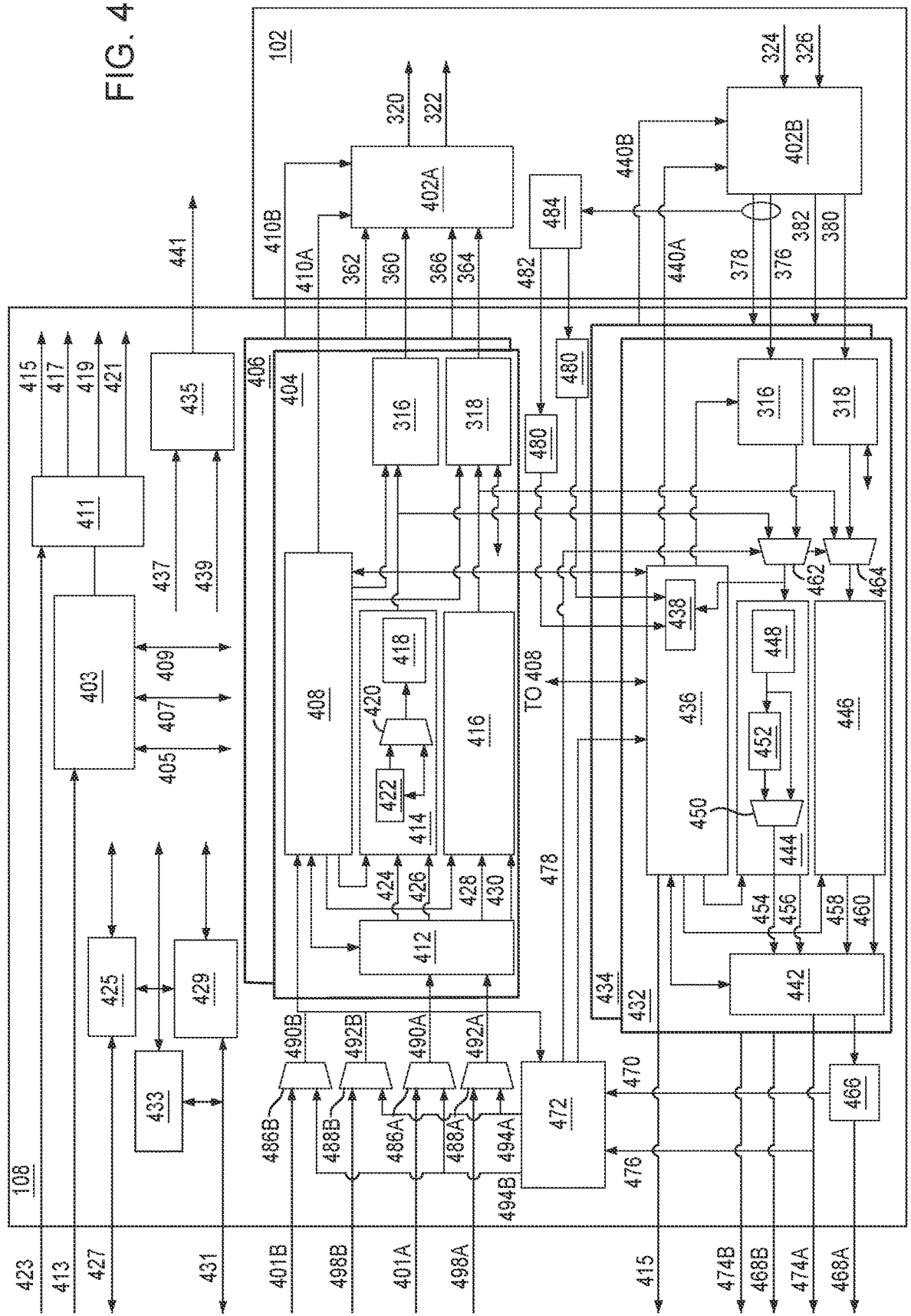
FIG. 4 is a high level block diagram of the logic for the EPHY of the testing device according to one embodiment.

FIG. 4 is a schematic illustration of the logic 108 for the EPHY 112 according to one embodiment. In one embodiment, the hardware 402A can be the MUXs 306, 308 and differential amplifiers 368, 370, while the hardware 402B can be the MUXs 310, 312 and the differential amplifiers 372, 374. The logic 108 includes one or more transmission blocks 404, 406. Each transmission block 404, 406 includes a finite state machine (FSM) 408 that is coupled to the hardware 402A via line 410A, 410B. Each transmission block 404, 406 also includes a remote monitor and maintenance interface (RMMI) MUX and wrapper 412 that is coupled to the FSM 408.

The FSM 408 is coupled to both a low speed logic block 414 and a high speed logic block 416. In one embodiment, the low speed logic block 414 includes a pulse width modulator (PWM) 418, as defined by the MIPI standard, which is coupled to the output of a MUX 420. In one embodiment, the high speed logic block 416 will be substantially identical to the low speed logic block 414 except that the high speed logic block 416 will operate according to the MIPI protocol. A data signal is input into the low speed logic block 414 from the RMMI MUX and wrapper 412 and split into a line that directly inputs to the MUX 420 and a line that inputs into a delay tap 422 that then inputs to the MUX 420. Both data signals and clock signals are fed to the low speed logic block 414 along lines 424, 426 respectively while data signals and clock signals are fed to the high-speed logic block 416 along lines 428, 430 respectively.

In one embodiment, signals are fed to the RMMI MUX and wrapper 412 through MUXs 486A, 488A (486B, 488B for transmission block 406). Specifically, data is feed from MUX 486A while a clock signal is fed from MUX 488A along lines 490A, 492A respectively (lines 490A, 492B for transmission block 406). Each MUX 486A, 486B, 488A, 488B receives two inputs. Data MUXs 486A, 486B receive an input along data line 494A from test mode block 472. Clock MUXs 488A, 488B receive a clock signal along clock line 496 from test mode block 472. In one embodiment, the second feed 494B to the MUXs 486A, 486B is a data transmission from an RMMI along line 498A, 498B. The second feed to MUX2 488A, 488B is a clock transmission along clock line 401A, 401B.

The logic 108 also includes one or more receiving blocks 432, 434. In one embodiment, each receiving block 432, 434 includes a FSM 436 that includes a line state detector 438. The FSM 436 is coupled to the hardware 402B via line 440A, 440B. Additionally, the FSM 436 is coupled to the FSM 408. In one embodiment, each receiving block 432, 434 also includes a RMMI MUX and wrapper 442 that is coupled to the FSM 436.

The FSM 436 is coupled to both a low speed logic block 444 and a high-speed logic block 446. The FSM 436 outputs an indication signal along line 415. In one embodiment, the low speed logic block 444 includes a PWM 448, as defined by the MIPI standard. The high speed logic block 446 is substantially identical to the low speed logic block 444. The output of the PWM 448 is split with a first signal fed to a MUX 450 and a second signal fed to the MUX 450 through a delay tap 452. The output of the MUX 450 is then fed along data line 454 to the RMMI MUX and wrapper 442 along with a signal that is fed along a clock line 456. A data signal and a clock signal are fed from the high-speed logic block 446 to the RMMI MUX and wrapper 442 via lines 458, 460 respectively.

In one embodiment, between the low speed interface 122 and the low speed logic block 444, a MUX 462 is present. The MUX 462 receives an output of the low speed interface 122, and the low speed logic block 414. The output of the MUX 462 is fed to the low speed logic block 444 as well as to the line state detector 438. Another output of the MUX 462 is fed to another MUX 464. MUX 462 receives the output from the high-speed interface 120 as well as the output of the high-speed logic block 416. The output of the MUX 464 is fed to the high-speed logic block 446.

In one embodiment, the output from the RMMI MUX and wrapper 442 is fed to a symbol clock recover element 466, the output of which is sends a signal along line 468A (468B for receiving block 434) and a clock signal along line 470 to a test mode block 472. In one embodiment, an additional output from the RMMI MUX and wrapper 442 is also sent out along data line 474A (474B for receiving block 434) with data also going to test mode block 472 along line 476. A clock signal is sent to the MUX 462 from the test mode block 472 along line 478.

The line state detector 438 receives an input additionally from a differential impedance detector 480, which itself receives information along line 482 from the output of the hardware 402B via a connector 484. The number of differential impedance detectors 480 is equal to the number of receiving lanes. For example, FIG. 4 shows two receiving lanes and hence, two differential impedance detectors 480. However, it is contemplated that there may be more than two receiving lanes. For example, it is contemplated that four receiving lanes may be present and hence, four differential impedance detectors 480 would be present.

In one embodiment, the logic 108 also includes a main controller 403 that is coupled to each receiving block 432, 434 via line 405; coupled to each transmission block 404, 406 via line 407; and coupled to the test mode block 472 via line 409. The main controller 403 is a logical controller of the logic 108 and is distinct from the controller 106 of the FPGA. The main controller 403 receives a signal along line 413 from a main or host device to permit a device external to the testing device 100 to control the testing device 100. In one embodiment, the main controller 403 is also coupled to a clock generator 411. The clock generator 411 generates the clock signal that is transmitted along lines 415, 417, 419, 421 to the various entities that require a clock signal as noted above, and receives the reference clock signal along line 423.

In one embodiment, the logic 108 also includes distance measuring equipment (DME) 425 that is coupled with the controller 403 and an RMMI configuration along line 427. DME 425 is also coupled to an EPHY registry 429 that is coupled to the system read/write register bus protocol, e.g., like Amba bus, via line 431. In one embodiment, the registry 429 contains the MIPI and EPHY regulations. A bus 433 is also coupled to line 431 and includes the high speed and low speed configuration regulations.

In one embodiment, the logic 108 also includes a low speed PHY, e.g., an MPHY, design for debug (DFD) block 435 that receives signals from the FSMs along line 437 and from another source along line 439. The low speed PHY DFD block 435 outputs along line 441.

In FIG. 4, the transmission and receiving blocks 404, 406, 432, 434 per lane are shown, and the MPHY specification defines the lanes orthogonally among the lands and paths. It is again noted that while FIG. 4 simply shows two lanes, the disclosure is not to be limited to two lanes. Rather, it is to be understood that more lanes, such as four lanes as allowed by the MIPI standard, is contemplated. The FSM 408, 436 controls the hardware 402A, 402B, the MUX 306, 308, 310, 312. The FSM 408, 438 has a sub block that implements the low speed using the PWM 418, 448 on a per land basis. The sub block also implements the high speed encoding/decoding of data to the serial line interface on a per lane basis. The interface to the upper layer is a fixed 40-bit/lane that will be increased to 80 to 160 bit/lane when the speed/gear increases to future generations of the protocols such as G5 or G6.

The transmission blocks 404, 406 operate to either 'speed up' or 'slow down' the communication that is sent to the DUT 114. More specifically, the elements in the transmission blocks 404, 406 that are discussed above function to change the speed of the communication, if necessary, to the DUT 114. It is contemplated that the testing device 100 and the DUT 114 may operate at the same speed and/or protocol and thus necessitate no change in speed. However, for all cases where the speed needs to be changed, the transmission blocks 404, 406 function to change the speed to the appropriate speed and/or protocol of the DUT 114.

On the receiving side, blocks 432, 434 operate to either 'speed up' or 'slow down' the communication that is received from the DUT 114. More specifically the elements in the receiving blocks 432, 434 that are discussed above function to change the speed of the communication, if necessary, to the testing device 100. It is contemplated that the testing device 100 and the DUT 114 may operate at the same speed and/or protocol and thus necessitate no change in speed. However, for all cases where the speed needs to be changed, the receiving blocks 432, 434 function to change the speed to the appropriate speed and/or protocol of the testing device 100.

The logic 108 and testing device 100 support scaling to several generations of devices. The EPHY low level of blocks 404, 406, 432, 434 and the FSMs are configured to reflect to the tester system the entire interface state, such as the accurate point of entering hibernation state, the existing hibernation state, a stall/sleep state, burst start/ends on the transmission or receive lines, and more, which will allow controlling the interface accurate timing in order to enforce and measure the DUT 114 and also mimic other host devices.

The design of the FPGA testing device gives flexibility to support any specification subversion updates without the need of an ASIC production cycle (i.e., cost and time to market) and even aligns with out of specification devices, which is beneficial when the specification is not yet closed. The DFD capability is much higher compared to external PHY chips. The system will capture and log any event necessary in order to debug a large scale of devices. Additionally, there is an ability to sense the real DUT interface for tooling capabilities. The embodiments discussed herein also are ready for future generation support (e.g., G5 support) without relying on a new test chip, thus requiring no additional costs. It is to be noted that the MUX and amplifier can be upgraded as needed. For example, for 24 Gb/s, the MUX and amplifier can be upgraded to 12 GHz. The current host tester BOM is reduced with the embodiments discussed herein, and the FPGA I/O count is reduced because there is no additional testing chip, which also reduces the FPGA cost in the long run. The ability to support multiple hosts via a single tester platform is beneficial.

It is important to note that for UFS protocol, the EPHY can support up to G5 (24 Gb/s) and many generations into the far future such as G6 (48 Gb/s). The ability for EPHY to support future generations will depend on the capability of the FPGA GT PHY.

The embodiments discussed herein are applicable to any host device that uses MIPI standard on FPGA devices. Additionally, the MIPI standard is to be understood to be utilized for more applications than UFS flash memory and thus the embodiments disclosed herein are not to be limited to UFS flash memory. More specifically, the embodiments disclosed herein may be used on any platform or appliance that uses any MPHY I/F (e.g., Liquid Crystal Displays, Wi-Fi, etc.) and with any peripheral to the FPGA without the need of an external MPHY test-chip. In other words, EPHY is applicable to any platform or appliance that uses MPHY and any peripheral to an FPGA without the use of an external MPHY test chip. The EPHY uses the core GT IOs in the FPGA, and the EPHY can be multiplied in the same FPGA and serve several MIPI products according the amount of GT IOs of the used FPGA part.

In one embodiment, a testing device comprises: a field programmable gate array (FPGA); and an embedded physical layer (EPHY). The EPHY includes: a logic portion having a first logical phy and a second logical phy, wherein the logic portion is disposed in the FPGA; and a glue hardware portion. The glue hardware portion includes: a first differential amplifier; and a first multiplexer (MUX) coupled to the first differential amplifier, wherein the testing device is capable of receiving and sending signals at a first speed, wherein the testing device is capable of receiving and sending signals at a second speed, and wherein the second speed is greater than the first speed. The glue hardware further comprises: a second differential amplifier; and a second MUX coupled to the second differential amplifier. The first MUX and the first differential amplifier are coupled to the FPGA using a first transmission line, wherein the second MUX and the second differential amplifier are coupled to the FPGA using a second transmission line. The testing device further comprises: a first receiving line coupled to the FPGA; a third differential amplifier coupled to the first receiving line; and a third MUX coupled to the third differential amplifier. The testing device further comprises: a second receiving line coupled to the FPGA; a fourth differential amplifier coupled to the second receiving line; and a fourth MUX coupled to the fourth differential amplifier. The glue hardware further comprises an impedance detection unit coupled to the FPGA. The impedance detection unit comprises an adjustable regulator and one or more comparators.

In another embodiment, an embedded physical layer (EPHY) comprises: a glue hardware portion; and a logic portion, wherein the logic portion comprises: a plurality of transmission blocks that each includes: a transmission finite state machine (FSM); a transmission multiplexer (MUX) coupled to the transmission FSM; a first PHY of a first speed coupled to the transmission FSM; and a second PHY of a second speed coupled to the transmission FSM, wherein the second speed is greater than the first speed; and a plurality of receive blocks that each includes: a receive FSM; a receive MUX coupled to the receive FSM; a third PHY of a third speed coupled to the receive FSM; and a fourth PHY of a fourth coupled to the receive FSM, wherein the fourth speed is greater than the third speed. The EPHY further comprising a differential impedance detector coupled to the receive FSM. The plurality of transmission blocks each additionally include a pulse width modulator coupled with the first PHY. The plurality of receive blocks each additionally include a pulse width modulator coupled with the third PHY. A number of the plurality of transmission blocks is equal to a number of the plurality of receive blocks. A plurality of MUXs are coupled to each transmission block. The plurality of MUXs is coupled to the transmission MUX for each transmission block. The EPHY further comprises a controller coupled to each transmission block and each receive block. The EPHY further comprises a clock generator coupled to the controller. The transmission FSM is coupled to the receive FSM.

In another embodiment, a testing device comprises: a field programmable gate array (FPGA); means to increase amplitude of a signal received from a device under testing (DUT) of a first speed to an amplitude of a signal of a second speed, wherein the means to increase is coupled to the FPGA; and means to decrease amplitude of a signal received from a DUT of the second speed to an amplitude of a signal of the first speed, wherein the means to decrease is coupled to the FPGA. The testing device further comprises means to detect entering into and exiting from hibernation states. The means to increase and the means to decrease are distinct.

The device described herein can accommodate both high speed PHYs as well as low speed PHYs. The device provides flexibility to support any specification subversion updates without the need of ASIC production cycle.

While the foregoing is directed to embodiments of the present disclosure, other and further embodiments of the disclosure may be devised without departing from the basic scope thereof, and the scope thereof is determined by the claims that follow.

What is claimed is:

1. A testing device, comprising:
a field programmable gate array (FPGA); and
an embedded physical layer (EPHY), the EPHY including:
a logic portion having a first logical phy and a second logical phy, wherein the logic portion is disposed in the FPGA, and wherein the logic portion communicates with the FPGA through the first and second logical phys; and
a glue hardware portion, wherein the logic portion communicates with a device under test (DUT) through the glue hardware portion, the glue hardware portion including:
a first differential amplifier; and
a first multiplexer (MUX) coupled to the first differential amplifier and the FPGA via a first line, wherein the testing device is capable of receiving and sending signals to and from the DUT at a first speed, wherein the testing device is capable of receiving and sending signals to and from the DUT at a second speed, wherein the second speed is greater than the first speed, and wherein the first differential amplifier is configured to reduce or increase the signals sent and received at the first speed or the signals sent and received at the second speed.

2. The testing device of claim 1, wherein the glue hardware further comprises:
a second differential amplifier; and
a second MUX coupled to the second differential amplifier.

3. The testing device of claim 2, wherein the first MUX and the first differential amplifier are coupled to the FPGA using a first transmission line, wherein the second MUX and the second differential amplifier are coupled to the FPGA using a second transmission line.

4. The testing device of claim 2, further comprising:
a first receiving line coupled to the FPGA;
a third differential amplifier coupled to the first receiving line; and
a third MUX coupled to the third differential amplifier.

5. The testing device of claim 4, further comprising:
a second receiving line coupled to the FPGA;
a fourth differential amplifier coupled to the second receiving line; and
a fourth MUX coupled to the fourth differential amplifier.

6. The testing device of claim 1, wherein the glue hardware further comprises an impedance detection unit coupled to the FPGA.

7. The testing device of claim 6, wherein the impedance detection unit comprises an adjustable regulator and one or more comparators.

8. A testing device, comprising:
a field programmable gate array (FPGA) comprising a controller; and
an embedded physical layer (EPHY) coupled to the controller, the EPHY including:
a logic portion comprising a low speed interface and a high speed interface, wherein the logic portion is disposed in the FPGA, and wherein the logic portion communicates with the FPGA through the low speed interface and the high speed interface; and a glue hardware portion, wherein the logic portion communicates with a device under test (DUT) through the glue hardware portion, the glue hardware portion comprising:
  a plurality of transmission multiplexers (MUXs);
  a plurality of receiving MUXs; and
  a plurality of differential amplifiers, wherein the testing device is capable of receiving and sending signals to and from the DUT at a first speed, wherein the testing device is capable of receiving and sending signals to and from the DUT at a second speed, wherein the second speed is greater than the first speed, and wherein:
    the low speed interface is coupled to a first transmission MUX of the plurality of transmission MUXs;
    the low speed interface is coupled to a first receiving MUX of the plurality of receiving MUXs;
    the high speed interface is coupled to a second transmission MUX of the plurality of transmission MUXs; and
    the high speed interface is coupled to a second receiving MUX of the plurality of receiving MUXs.

9. The testing device of claim 8, wherein the glue hardware portion is connected to the FPGA through one or more transmission lines or one or more receiving lines.

10. The testing device of claim 8, wherein the glue hardware portion further comprises:
  a first differential amplifier of the plurality of differential amplifiers coupled to the second transmission MUX; and
  a second differential amplifier of the plurality of differential amplifiers coupled to the second receiving MUX.

11. The testing device of claim 8, wherein the glue hardware further comprises:
  an impedance detection unit coupled to the FPGA; and
  a phase lock loop (PLL) coupled to the FPGA.

12. The testing device of claim 11, wherein the first receiving MUX and the second receiving MUX are coupled to the impedance detection unit.

13. The testing device of claim 8, wherein the glue hardware portion further comprises:
  a third differential amplifier of the plurality of differential amplifiers coupled to the first transmission MUX; and
  a fourth differential amplifier of the plurality of differential amplifiers coupled to the first receiving MUX.

14. The testing device of claim 8, further comprising one or more storage units coupled to the FPGA.

15. A testing device, comprising:
  a field programmable gate array (FPGA) comprising a controller; and
  an embedded physical layer (EPHY) coupled to the controller, the EPHY including:
    a logic portion comprising a low speed interface and a high speed interface, wherein the logic portion is disposed in the FPGA, and wherein the logic portion communicates with the FPGA through the low speed interface and the high speed interface; and
    a glue hardware portion, wherein the logic portion communicates with a device under test (DUT) through the glue hardware portion, the glue hardware portion comprising:
      a plurality of transmission multiplexers (MUXs);
      a plurality of receiving MUXs; and
      a plurality of differential amplifiers, wherein the testing device is capable of receiving and sending signals to and from the DUT at a first speed, wherein the testing device is capable of receiving and sending signals to and from the DUT at a second speed, wherein the second speed is greater than the first speed, and wherein:
        the low speed interface is coupled to a first transmission MUX of the plurality of transmission MUXs and a first differential amplifier of the plurality of differential amplifiers;
        the low speed interface is coupled to a first receiving MUX of the plurality of receiving MUXs and a second differential amplifier of the plurality of differential amplifiers;
        the high speed interface is coupled to a second transmission MUX of the plurality of transmission MUXs and a third differential amplifier of the plurality of differential amplifiers; and
        the high speed interface is coupled to a second receiving MUX of the plurality of receiving MUXs and a fourth differential amplifier of the plurality of differential amplifiers.

16. The testing device of claim 15, wherein the glue hardware portion is connected to the FPGA through one or more transmission lines or one or more receiving lines.

17. The testing device of claim 15 wherein the glue hardware further comprises:
  an impedance detection unit coupled to the FPGA; and
  a phase lock loop (PLL) coupled to the FPGA.

18. The testing device of claim 17, wherein the first receiving MUX and the second receiving MUX are coupled to the impedance detection unit.

19. The testing device of claim 15, further comprising one or more storage units coupled to the FPGA.

* * * * *